United States Patent
Kupce

[19]

[11] Patent Number: 6,064,207
[45] Date of Patent: May 16, 2000

[54] ADIABATIC PULSES FOR WIDEBAND INVERSION AND BROADBAND DECOUPLING

[75] Inventor: Eriks Kupce, Oxford, United Kingdom

[73] Assignee: Varian Associates, Inc., Palo Alto, Calif.

[21] Appl. No.: 08/692,855

[22] Filed: Jul. 26, 1996

[51] Int. Cl.$^7$ .................................................... G01V 3/00

[52] U.S. Cl. ............................................ 324/314; 324/309

[58] Field of Search .................................... 324/314, 307, 324/309, 300, 312, 311

[56] References Cited

U.S. PATENT DOCUMENTS

| | | | |
|---|---|---|---|
| 4,682,106 | 7/1987 | Vatis et al. | 324/311 |
| 5,235,280 | 8/1993 | Deimling | 324/314 |
| 5,285,159 | 2/1994 | Bodenhausen et al. | 324/314 |
| 5,448,170 | 9/1995 | Bodenhausen et al. | 324/314 |
| 5,581,182 | 12/1996 | Fu et al. | 324/309 |

*Primary Examiner*—Louis M. Arana
*Attorney, Agent, or Firm*—Edward Berkowitz

[57] ABSTRACT

An inversion pulse for wideband application is obtained from a simple nonlinear amplitude modulation wherein the amplitude is modulated in accord with $A(t)=A_0\{1-|\sin \beta t|^n\}$ and the entire pulse is frequency modulated such that the phase varies as $\phi(t)=\phi_0+\frac{1}{2} kt^2$.

4 Claims, 6 Drawing Sheets

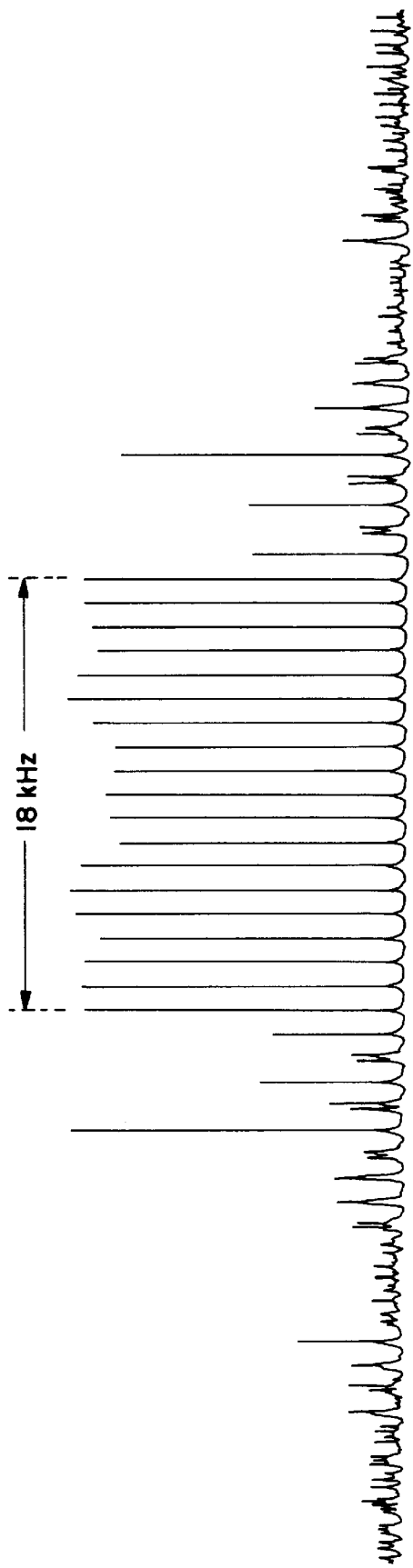

ADIABATIC PULSES FOR WIDEBAND INVERSION AND BROADBAND DECOUPLING

FIELD OF THE INVENTION

The invention is in the field of nuclear magnetic resonance (NMR) and relates particularly to adiabatic fast passage techniques for achieving nuclear spin inversion.

BACKGROUND OF THE INVENTION

A common operation in various NMR measurements is the inversion of the nuclear magnetization. This is commonly achieved by applying a 180° pulse at the RF resonant frequency. A high degree of homogeneity is not also obtained in either or both of the polarizing and RF fields and the frequency range over which such inversion is desired may be substantial. The application of NMR to spatial imaging is one example. Another is the case where it is desired to obtain heteronuclear decoupling over a relatively wide frequency interval.

Adiabatic fast passage is probably the most effective method for inverting nuclear spins over a wide frequency band. It also has the valuable property that the RF level is not critical, provided that it satisfies the adiabatic condition:

$$|d\theta/dt| \gg \omega_{eff} \quad \text{Equ. 1}$$

where $\omega_{eff} = \gamma B_{eff}$ is the effective field expressed in angular frequency units through the gyromagnetic ratio $\gamma$, given by the resultant of the applied RF field $\omega_1 = \gamma B_1$ and the resonance offset $\Delta\omega = \gamma \Delta B$, and where $\theta$ is the inclination of $B_{eff}$ with respect to the +x axis. This also implies that spatial inhomogeneities of $B_1$ or $B_0$ are not important in this application.

The adiabatic condition is most critical when the frequency sweep is near resonance ($B_{eff} \approx B_1$) and is more easily satisfied at more appreciable offsets where $B_{eff}$ is large. It is usual to quantify an adiabaticity factor $$Q = \omega_{eff}/|d\theta/dt| \quad \text{Equ. 2}$$

which should be large compared with unity. A factor of 5 is typical. This may be expressed as $$Q = (A + \Delta\omega^2)^{3/2}/\{A \, d\Delta\omega/dt - \Delta\omega dA/dt\} \quad \text{Equ. 3}$$

It is well known that an adiabatic sweep may be implemented either by sweeping the frequency ($d\Delta\omega/dt$) or by sweeping the RF amplitude ($dA/dt$), or both.

A second requirement for good spin inversion is that the effective field $B_{eff}$ should start on the +z axis and end on the −z axis. Thus a simple constant amplitude linear frequency sweep is unsuitable, because a finite offset $\Delta\omega$ remains at the extremities of the sweep, leaving $B_{eff}$ inclined with respect to the z axis. A symmetrical amplitude profile that goes asymptotically to zero is therefore indicated.

In the prior art, adiabatic fast passage was known to provide magnetic inversion which is relatively insensitive to inhomogeneity of either the RF or polarization field distribution. A frequency sweep is applied having some selected analytic time dependence. In the prior art Baum, Tycko and Pines have proposed a time dependence of the form tan ($\beta$t)), or sech($\beta$t) as taught by Silver, Joseph and Hoult. It is shown in the present work that the inversion pulse of the present invention permits inversion over a comparable bandwidth at the same adiabticity factor at lower RF amplitudes. This has practical consequences in lower required power ratings of components of RF probes for example.

SUMMARY OF THE INVENTION

It is an object of the present invention to achieve adiabatic fast passage spin inversion over a relatively wide bandwidth.

It is a further object to obtain the desired adiabatic fast passage spin inversion with significantly less RF power dissipation than employed in the prior art.

It is again a further object to assure that the inversion of the effective field, $B_{eff}$, should be aligned closely with the ±z axis at the beginning and end of the inversion operation.

In accordance with the above objects there is provided a composite pulse which is effective over a relatively wideband with a simple linear frequency sweep and smooth joinder of the amplitude to zero at the extremities of the pulse.

BRIEF DESCRIPTION OF THE DRAWINGS

FIG. 2b shows the inversion profiles corresponding to the pulses of FIG. 2a.

FIG. 3b shows the real and imaginary parts of the sech pulse of prior art for the same duration, peak intensity and $Q_0$ as in FIG. 3a.

FIG. 6 records the decoupling performance of another prior art approach (GARP) for comparison with FIG. 5a.

DESCRIPTION OF THE PREFERRED EMBODIMENTS

Figure 1:
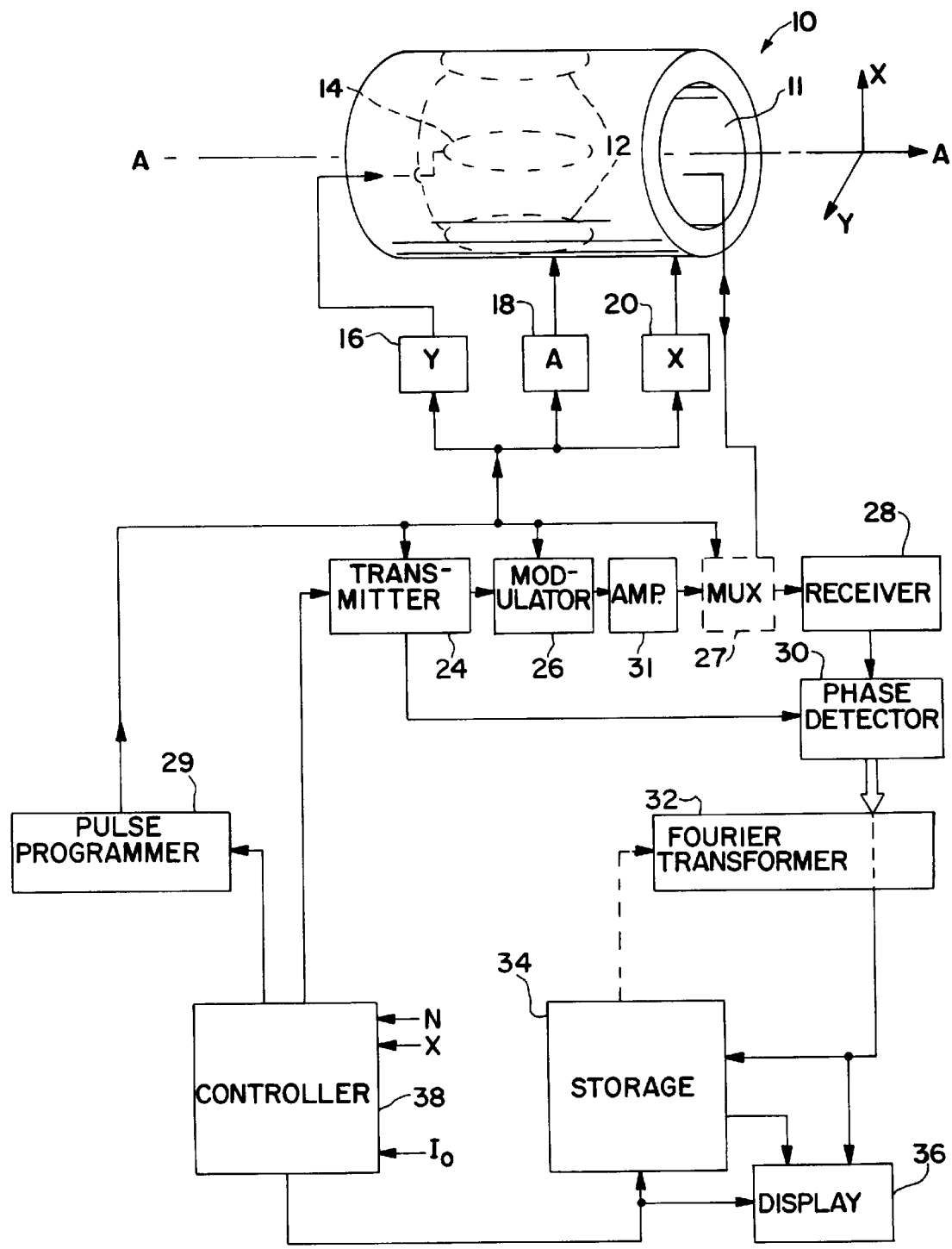
FIG. 1 shows a typical context for the invention.

The context of the invention is best described with the aid of FIG. 1. At FIG.1 there is shown an idealized NMR apparatus. A magnet 10 having bore 11 provides a main dc magnetic field. In order to control the magnetic field with required precision there are provided magnetic field gradient coils 12 and 14 schematically represented. These and additional gradient coils (not shown) may be driven by gradient power supplies 16, 18 and 20 to function in a representative manner to compensate inhomogeneities of the magnetic field on a dc basis, or alternatively, to supply desired gradients on a pulsed basis for spatially discriminatory experiments. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a probe circuit as further described which is located in the interior of bore 11 and not shown in FIG. 1. Resonant samples are induced in a receiver coil proximate the sample within bore 11 and also not shown.

As shown in FIG. 1, RF power is provided from transmitter 24, modulated by modulator 26 to yield amplitude modulated pulses of RF power which are amplified by amplifier 31 and then directed via multiplexer 27 to the RF transmitter coil of the probe (not shown) located within bore 11. Transmitter and receiver coils are clearly not concurrently active as such. The identical coil may be employed for both functions if so desired. Thus a multiplexer 27 may be provided to isolate the receiver from the transmitter. In the case of separate transmitter and receiver coils, element 27, while not precisely a multiplexer will perform a similar isolation function to control receiver operation.

The modulator 26 is controlled by pulse programmer 29 to provide all the pulses of desired amplitude, duration and phase relative to the RF carrier at preselected time intervals. The pulse programmer also controls the gradient power supplies 16, 18 and 20 if such gradients are employed on a pulsed basis. These gradient power supplies represent also the maintenance of selected static gradients in the respective gradient coils if so required.

The transient nuclear resonance wave form is processed by receiver 28 and further resolved in phase quadrature through phase detector 30. Phase resolved time delaying signals from phase detector 30 are presented to Fourier transformer 32 for transformation to the frequency domain in accordance with specific requirements of the processing of the acquired data. Conversion of the analog resonance signal to digital form is commonly carried out on the phase resolved signals through analog to digital converter (ADC) structures which may be regarded as a component of phase detector 30 for convenience.

It is understood that Fourier transformer 32 may in fact act upon a stored (in storage 34) representation of the phase resolved data. This reflects the common practice of averaging a number of time domain phase resolved wave forms to enhance the signal-to-noise ratio. The transformation function is then applied to the resultant average wave form. Display device 36 operates on the acquired data to present same for inspection. Controller 38 most often comprising one or more computers, controls and correlates the operation of the entire apparatus.

In the present invention, modulator 26 comprises both frequency and amplitude modulation capability synchronized by controller 38, e.g., a digital processor. These modulations are applied to produce a basic example of the invention in the form of a composite pulse. This is a particular modulation of the RF carrier for achieving adiabatic fast passage inversion of nuclear spins over a relatively wide bandrange of frequency.

The present invention includes a linear frequency sweep, where the phase increases as $$\phi(t)=\phi_0+\tfrac{1}{2} kt^2$$

If this sweep rate satisfies the adiabatic condition at resonance, it will also satisfy it at all other offsets because $B_{eff} \geq B_1$. In order to bring the amplitude smoothly down to zero at the extremities of the sweep an amplitude profile is implemented to provide $$A(t)=A_0\{1-|\sin \beta t|^n\}$$

for initial and terminal portions of the sweep. The argument $\beta t$ is in the range $-\pi/2<\beta t<+\pi/2$ but for the present descriptive purpose one may regard this argument as increasing for the rise of the pulse, then decreasing for the fall of the pulse, in the first quadrant. The index n determines the severity of the roundoff and joinder to the baseline.

Figure 2A:
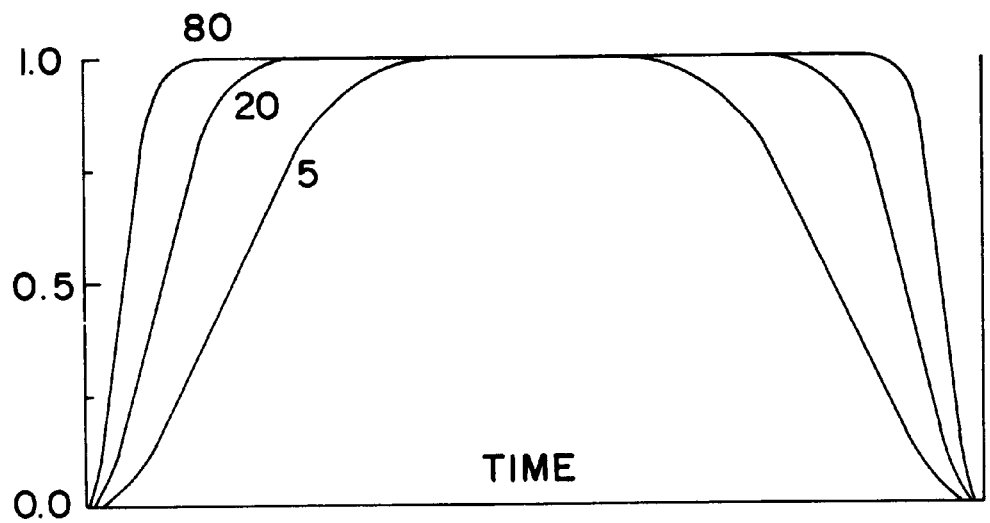
FIG. 2a shows amplitude envelopes for three examples of the pulse of the invention for values of n=5, 20 and 80.
Figure 2B:
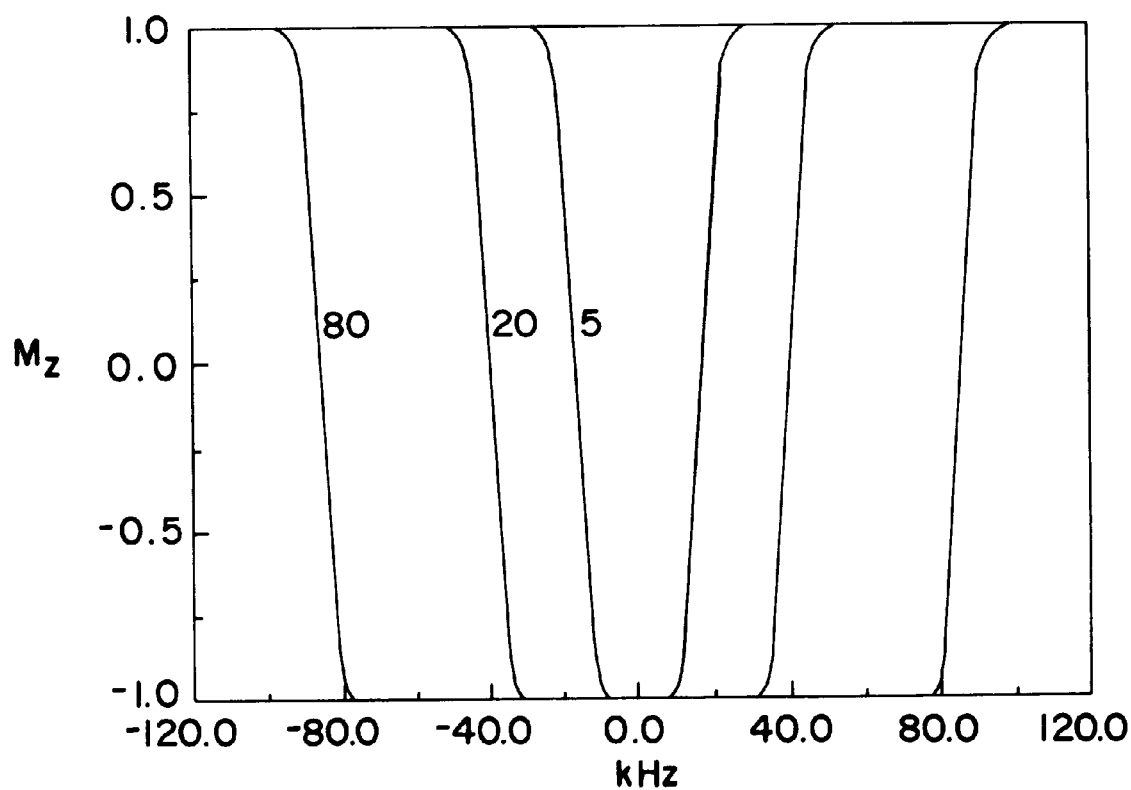

The proposed adiabatic pulse has these key properties: wideband, uniform rate, and smooth truncation. We therefore suggest the acronym WURST, to recall the characteristic sausage shape of the inventive pulse (illustrated at FIG. 3b). Where appropriate, the index n is appended, for example WURST-20. The product of pulse duration and the total sweep rate is set to 2n or greater. The influence of n may be judged from FIG. 2. The more square the shoulders of the pulse shape (FIG. 2a), the wider the effective inversion profile (FIG. 2b). This stretching operation is the key, but it cannot be continued indefinitely, because a limit is set by the permissible pulse duration.

Figure 4:
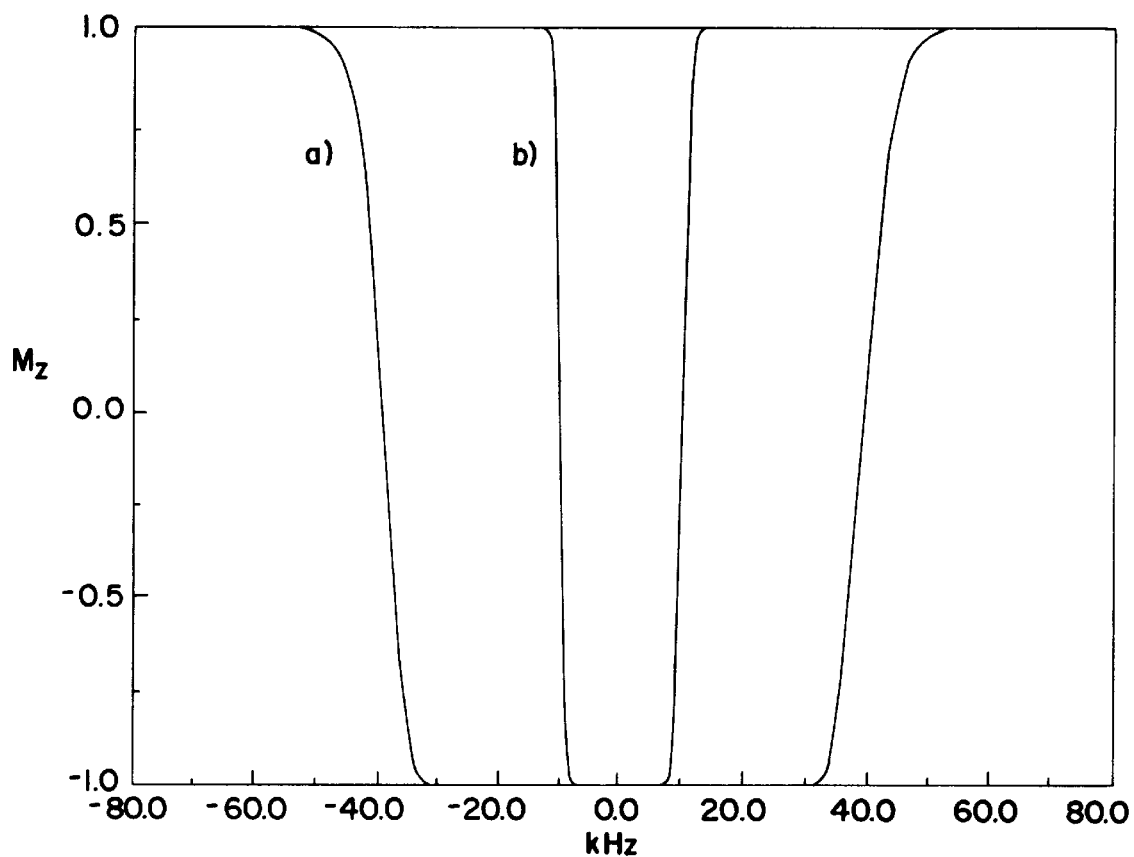
FIG. 4 compares inversion profiles for a pulse of the present invention with a sech pulse of prior art.

The hyperbolic secant pulse of prior art seems to have acquired an almost mystical significance for adiabatic fast passage. This form of adiabatic fast passage is discussed by Baum, Tych and Pines, Phys. Rev. A, vol.32, p. 3435 (1985) and by Silver, Joseph and Hoult, Phys. Rev. A, vol.31, p.2753 (1985). Its supposed superiority for wideband inversion is challenged by comparing the bandwidth of WURST-20 with that of a hyperbolic secant pulse with the same maximum amplitude value. Both pulses have the same duration ($\tau=1.0$ ms) and the same adiabaticity on resonance (Qo=5), but WURST-20 has a much wider inversion band (FIG. 4). It is therefore safer to use in practice, since to achieve a comparable bandwidth, the hyperbolic secant pulse must employ a far higher maximum amplitude ($A_0$) setting and this could eventually lead to radiofrequency breakdown of probe capacitors or in some instances, the available power may be limited.

Figure 3A:
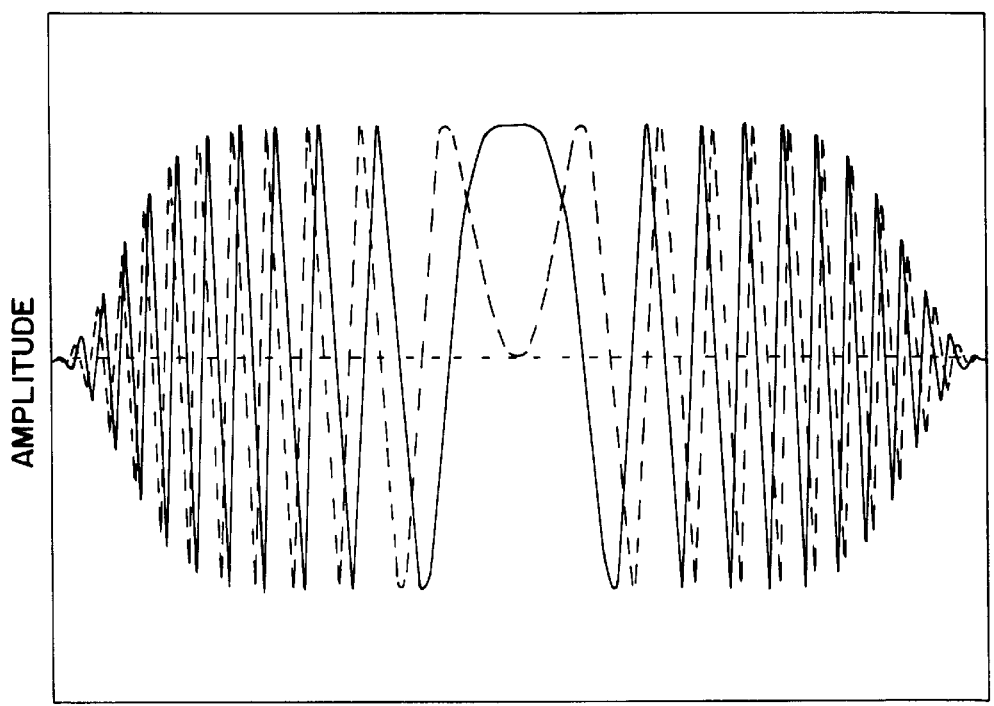
FIG. 3a displays real and imaginary parts of the n=20 composite pulse of the present invention.
Figure 3B:
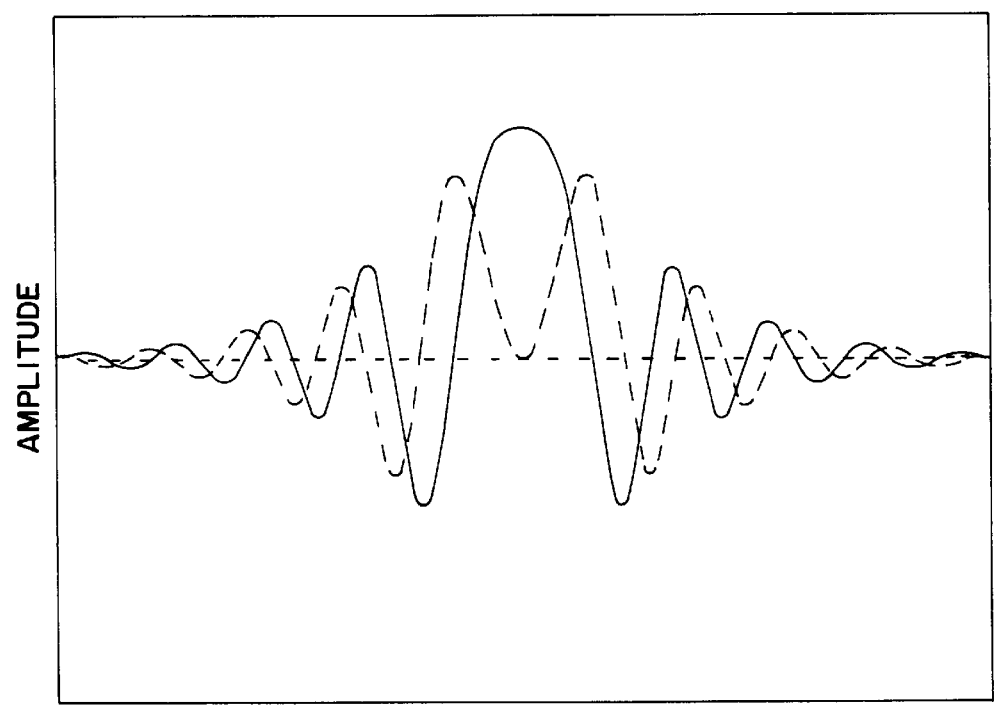

The time development of the real and imaginary components of WURST-20 and the hyperbolic secant pulse of prior art are compared in FIGS. 3a and 3b. Both pulses have the same duration $\tau=1.0$ ms, same peak RF intensity $\gamma B_1(max)/2\pi=8.56$ kHz) and adiabaticity at resonance $Q_0=5$. This gives some insight into the origin of the increased bandwidth. In the important region near exact resonance, the hyperbolic secant and the tangential sweep methods both use an approximately linear frequency sweep at a rate determined by the peak radiofrequency level $A_0$, and the required adiabaticity factor at resonance, $Q_o$. From Eq. [3] the maximum permissible sweep rate near resonance is $$\{d(\Delta\omega)/dt\}_{max}=A_0^2/Q_0 \qquad \text{Equ. 4}$$

whatever the method used. WURST retains the same (linear) sweep rate, but extends its range much further from resonance, keeping the amplitude constant except at the extremities. It is clear that the result of rounding the edges of the amplitude profile is similar to that of accelerating the sweep at the beginning and end, as in the "tangential sweep" method Baum, Tycko and Pines. The critical stage of spin inversion occurs in the central region of the sweep, where $d\Delta\omega/dt$ is essentially constant.

If Eq. 4 is expressed in terms of the two dimensionless parameters $a=\tau A_0/2\pi$, the product of pulse duration and peak amplitude, and $b=\pi\Delta F$, the product of pulse duration and the total sweep range $\Delta F$, then $$b=2\pi a^2/Q_o \qquad \text{Equ. [5]}$$

For WURST-40, the effective bandwidth $\Delta F^*$ amounts to roughly 80% of the total sweep range $\Delta F$. Thus, for a given pulse durations $\Delta F^*$ is proportional to the square of the radiofrequency amplitude, whereas in conventional hard-pulse experiments the bandwidth is only a linear function of amplitude. This is why the adiabatic sweep is superior.

One useful application of an efficient spin inversion scheme is broadband decoupling. Decoupling carbon-13 while observing the proton resonance presents a suitable challenge. We have tested WURST decoupling and determined its figure of merit, the ratio of effective bandwidth to the radiofrequency level:

$$\Xi = 2\Delta B_{max}/B_2(rms) \qquad \text{Equ. [6]}$$

This modified expression for $\Xi$ uses the root-mean-square value of $B_2$ in order to take account of the amplitude modulation, since we are concerned to make comparisons at the same radiofrequency power. The usual convention is followed, that the effective bandwidth is defined by the region where the decoupled signal exceeds 80% of its maximum height, with a line broadening of 1.5 Hz.

Figure 5B:
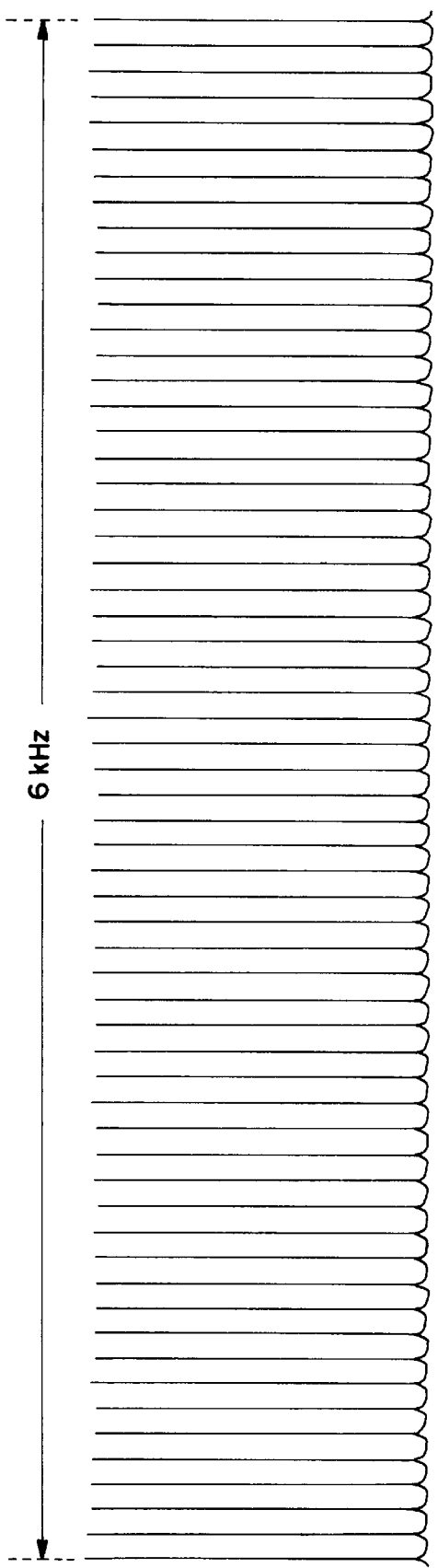
FIG. 5b is a the same as FIG. 5a for 100 Hz steps over ±3 kHz in the center of the band.
Figure 5A:
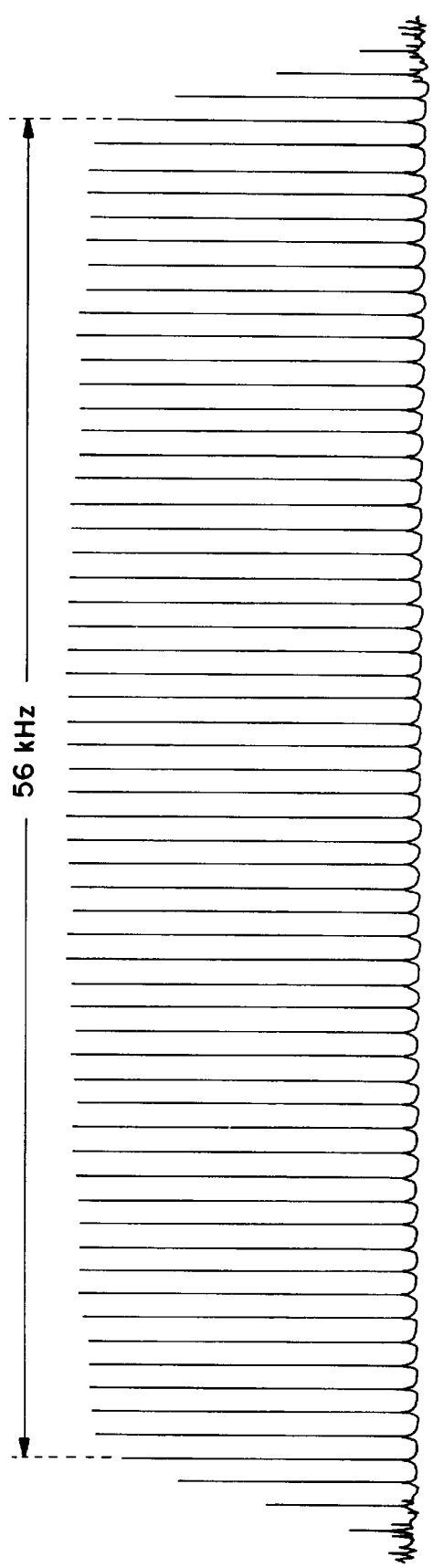
FIG. 5a is the performance of the invention for $C^{13}$ decoupled proton spectra over a ±32 kHz range in 1 kHz steps.

Experimental tests were performed on a Varian VXR-400 spectrometer with a sample of 1% methyl iodide ($J_{CH}$=151.2 Hz) enriched in carbon-13. The standard heteronuclear multiple-quantum correlation (HMQC) technique was employed in order to suppress the proton signal arising from residual carbon-12 molecules. Carbon-13 decoupling was tested by stepwise examination of a range of decoupler offsets. The peak decoupler level corresponded to $\gamma B_2(max)/2\pi$=3.67 kHz. The WURST-40 pulse has an adiabaticity factor Q=2.45. It was swept at a rate of 35 MHz (always in the same sense) and had an overall duration of 2.0 ms, determined by the requirement that the repetition rate be fast compared with the coupling constant $J_{IS}$. No interpulse delays were used. The phase cycle (++−−+−−+) of Levitt (J. Mag. Res., vol.43, p.502) was employed to compensate imperfections. Improved performance has been subsequently obtained using a five step phase cycle (0°, 150°, 60°, 150°, 0°). The observed effective bandwidth $\Delta F^*$ was 56 kHz (FIG. 4a). After conversion of the peak radiofrequency level to the rms value (3.36 kHz), this corresponds to a figure of merit $\Xi$=16.7, which may be compared with results from other known decoupling methods. For comparison, the performance of the GARP broadband decoupling scheme (Shaka, Barker and Freeman, J. Mag. Res., vol. 64, p.547) under identical experimental conditions is shown in FIG. 5; it has an effective bandwidth of only 18 kHz ($\Xi$=4.9).

Broadband decoupling of the present invention employs a linear (adiabatic) frequency sweep and a constant radiofrequency level (except at the extremities of the sweep). It is simple to implement and enjoys a surprisingly high figure of merit in terms of the effective bandwidth for a given radiofrequency power; it also operates at a lower peak radiofrequency level than an equivalent adiabatic pulse based on a hyperbolic secant. Because the spin inversion is quite uniform, only a very simple phase cycle (MLEV-8) is required. Already the WURST-type pulse offers a bandwidth exceeding 50 kHz, more than adequate for decoupling carbon-13 in any future spectrometer operating at 1 GHz for protons. The uniformity of decoupling over the effective bandwidth is quite satisfactory; there are no evident undulations, as may be judged by the more finely sampled section in FIG. 5b. One advantage of the smooth truncation of the radiofrequency amplitude at the extremities of the sweep is that there is negligible out of band excitation. As with all repetitive decoupling schemes, WURST-40 decoupling generates cycling sidebands. These can be significantly reduced (but not eliminated) by combining free induction signals obtained with opposite senses of adiabatic sweep and by the use of selected interval between pulses.

Although the present invention has been described in detail with reference to the embodiments above presented, it is not intended that the invention be restricted to such embodiments. It will be apparent to those skilled in the art that various departures from the foregoing description may be made without departing from the scope or spirit of the invention. Therefore it is intended that the invention be limited only by the following claims.

What is claimed is:

1. A method to achieve inversion of nuclear magnetization by adiabatic fast passage during an NMR study of a sample, said sample comprising a selected nuclear species of Larmor frequency $\omega_0$, said method comprising the steps of:

(a) during a first time interval $t_\alpha$, $t_0 \leq t_\alpha < t_1$, amplitude modulating an RF carrier in accord with a time dependence $A(t)=A(max)\{1-|\sin \beta t|^n\}$, where n is a positive number and $\beta t$ increases in the range from 0 to $\pi/2$ and A(max) is the greatest amplitude to be achieved, (b) concurrently with step (a), frequency modulating said RF carrier in a linear sweep to vary the phase thereof in accord with a form $\phi(t)=\phi_0+\frac{1}{2}kt_\alpha^2$ where $\phi_0$ is an initial phase and k is a selected proportionality constant, whereby a first signal portion is generated, (c) during a second time interval $t_\beta$, $t_1 \leq t_\beta < t_2$, immediately subsequent to said first time interval, continuing said frequency modulating said RF carrier in said linear sweep while maintaining said amplitude at said constant value A(max) during the interval $t_\beta$, whereby a second signal portion smoothly continuous with said first signal portion is generated, (d) during a third time interval $t_\gamma$, $t_2 \leq t_\gamma < t_3$, immediately subsequent to said second time interval, amplitude modulating said RF carrier in accord with said time dependence of step (a) wherein said variable $\beta t$ decreases over the range $\pi/2$ to 0, (e) concurrently with step (d), frequency modulating said RF carrier in said linear sweep of opposite sense to step (b), whereby a third signal portion, smoothly continuous with said second signal portion is generated to complete a composite inversion pulse, and (f) applying at least one said composite inversion pulse to said sample.

2. The method of claim 1 wherein said steps (a) through (e) are repeated and the value of $\phi_0$ is selectably changed at each repetition.

3. The method of claim 1 wherein said quantity n is an integer.

4. The method of claim 1 wherein the product of $(t_3-t_0)$ with the sweep rate of said linear sweep is less than 2n.

* * * * *